(12) United States Patent
Chen et al.

(10) Patent No.: US 6,994,951 B1
(45) Date of Patent: Feb. 7, 2006

(54) METHOD OF FABRICATING A STAMPER BY HALF-TONE TECHNOLOGY

(75) Inventors: Irene Chen, Tao-Yuan Hsien (TW); Tien-Yu Chou, Tao-Yuan Hsien (TW); Jyh-Huei Lay, Tao-Yuan Hsien (TW); Yuan-Hung Wang, Tao-Yuan Hsien (TW); Jo-Wen Wu, Tao-Yuan Hsien (TW); Chin-Chen Yang, Tao-Yuan Hsien (TW); Chuan-Lun Hsu, Tao-Yuan Hsien (TW)

(73) Assignee: U-Tech Media Corp., Tao-Yuan Hsien (TW)

( * ) Notice: Subject to any disclaimer, the term of this patent is extended or adjusted under 35 U.S.C. 154(b) by 19 days.

(21) Appl. No.: 10/711,778

(22) Filed: Oct. 4, 2004

(51) Int. Cl.
*B29C 33/38* (2006.01)

(52) U.S. Cl. .................. 430/320; 430/321; 430/330

(58) Field of Classification Search ............... None
See application file for complete search history.

(56) References Cited

U.S. PATENT DOCUMENTS

| 6,071,652 A | * | 6/2000 | Feldman et al. ............ 430/5 |
| 2003/0209819 A1 | * | 11/2003 | Brown et al. ............ 264/2.5 |

FOREIGN PATENT DOCUMENTS

| EP | 0 475 741 A | * | 3/1992 |
| JP | 7-323428 A | * | 12/1995 |

* cited by examiner

*Primary Examiner*—John A. McPherson
(74) *Attorney, Agent, or Firm*—Winston Hsu

(57) ABSTRACT

First, a substrate is provided, and a half-tone mask is employed to perform an exposing and developing process for forming a plurality of photoresist patterns having different thickness. Then, a flow process is performed to heat the photoresist patterns so that each photoresist pattern has a microlens surface. Following that, a metal plate is formed on the substrate for obtaining a plurality of patterns, which are opposite to the plurality of photoresist patterns, on the bottom surface. Finally, the metal plate is removed from the substrate, and combined with an insert mold.

7 Claims, 5 Drawing Sheets

METHOD OF FABRICATING A STAMPER BY HALF-TONE TECHNOLOGY

BACKGROUND OF INVENTION

1. Field of the Invention

The present invention relates to a method of fabricating a stamper, and more particularly, to a method capable of forming a plurality of patterns having microlens surfaces and large dimensions, or a plurality of patterns with different heights onto a stamper. The above stamper can be utilized to fabricate a light guide plate.

2. Description of the Prior Art

A light guide plate (LGP) is an important element of an LCD. The light guide plate functions to reflect the light source generated by a back light module toward each pixel region so that the LCD has a brilliant and uniform brightness. In order to improve the light usage, the light guide plate normally includes a plurality of patterns thereon so as to transform point light source into a planar light source. The size or shape of the patterns, however, varies according to different optic designs of the back light module or different allocations of the fluorescent tubes.

Since the light guide plate is substantially composed of plastic materials, it is generally fabricated by injection molding technology. At present, the insert mold is often combined with a stamper that has patterns thereon to form the light guide plate. Please refer to FIG. 1 to FIG. 3. FIG. 1 to FIG. 3 are schematic diagrams illustrating a conventional method of forming a stamper having a plurality of microlens patterns thereon. As shown in FIG. 1, a substrate 10 is provided, and a photo resist layer 20 is then coated onto the substrate 10. As shown in FIG. 2, an exposing and developing process is performed by a photo mask (not shown) to remove parts of the photo resist layer 12 so as to form a plurality of photo resist patterns (such as 14A and 14B).

As shown in FIG. 3, a flow process is then performed in order to make each photo resist pattern have a smooth microlens surface. In the flow process, the temperature of the photo resist patterns is raised over its glass transition temperature, and three kinds of tensions, which are tension between photo resist and atmosphere ($\gamma_{P\text{-}A}$), tension between photo resist and substrate ($\gamma_{p\text{-}s}$), and tension between substrate and atmosphere are acted on the each photo resist pattern($\gamma_{s\text{-}A}$). While these three tensions reach to an equivalent state, a photo resist pattern having a microlens surface (such as 14A) will be formed.

As described, the dimensions of the microlens patterns change with different designs of the light guide plate. As long as the microlens patterns to be formed have large dimensions (for example large radius at the bottom of the photo resist pattern), the contact angle of the photo resist pattern is not capable of supporting the microlens surface. Consequently, the photo resist pattern will collapse (as 14B shown in FIG. 3). The conventional method suffers from the collapse of the photo resist patterns.

In addition, in order to improve the light usage (particularly for a large size light guide plate), many light guide plates require the microlens patterns that have different heights or depths. These requirements obviously cannot be achieved by the conventional method. Therefore, the remedy so far is to form the stamper that has a plurality of microlens patterns having different heights or depths mechanically after the stamper is fabricated. Unfortunately, the mechanical way is time-consuming. What is worse is that the microlens patterns become rough after the mechanical treatment. The stamper with rough microlens patterns cannot be used to fabricate a high quality light guide plate.

In view of this shortcoming, developing a new method of forming a stamper that has smooth microlens patterns is important for fabricating a light guide plate that have microlens patterns with different heights or depths.

SUMMARY OF INVENTION

It is therefore a primary objective of the present invention to provide a method of forming a stamper by half-tone technology. Consequently, a light guide plate having microlens patterns with different heights or depths can be fabricated by use of the stamper.

According to the claimed invention, a method of forming a stamper by half-tone technology is provided. The method is implemented as follows. First, a substrate is provided, and a photo resist layer is coated onto the substrate. Then an exposing and developing process is performed with a half-tone mask to remove a portion of the photo resist layer so as to form a plurality of photo resist patterns having different heights. A flow process is then followed for forming a microlens surface on each photo resist pattern. Thereafter, a metal layer is formed to overlay the substrate and the photo resist patterns so as to form a plurality of patterns complementary to the photo resist patterns on a bottom surface of the metal layer. Afterward, the metal layer is separated from the substrate and the photo resist patterns. Finally, a top surface of the metal layer is planarized, and the top surface of the metal layer is combined with an insert mold.

The method of the present invention utilizes a half-tone to perform an exposing and developing process so as to form a plurality of photo resist patterns having different heights. In addition, the method of the present invention is able to prevent the collapse of the photo resist patterns, and therefore can be applied to form the photo resist patterns having large dimensions. Consequently, a light guide plate having a plurality of patterns with large dimensions or different heights can be fabricated.

These and other objectives of the present invention will no doubt become obvious to those of ordinary skill in the art after having read the following detailed description of the preferred embodiment that is illustrated in the various figures and drawings.

DETAILED DESCRIPTION

Figure 1:
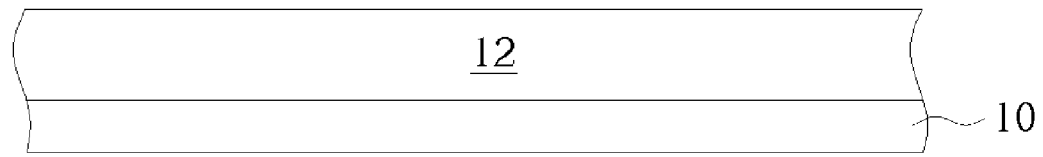
FIG. 1 to FIG. 3 are schematic diagrams illustrating a conventional method of forming a stamper having a plurality of microlens patterns thereon.
Figure 2:
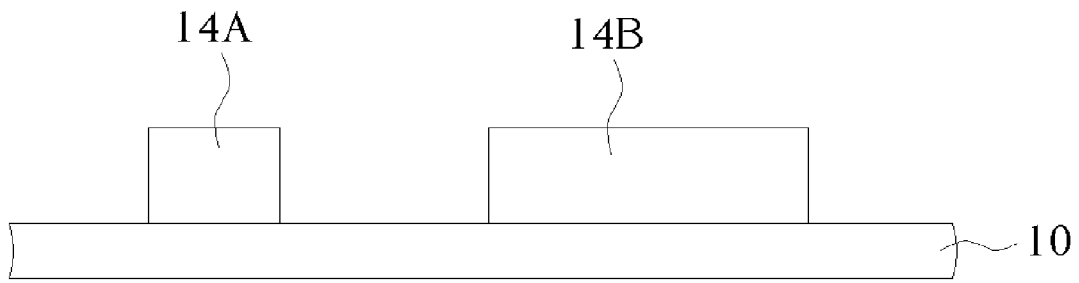
Figure 3:
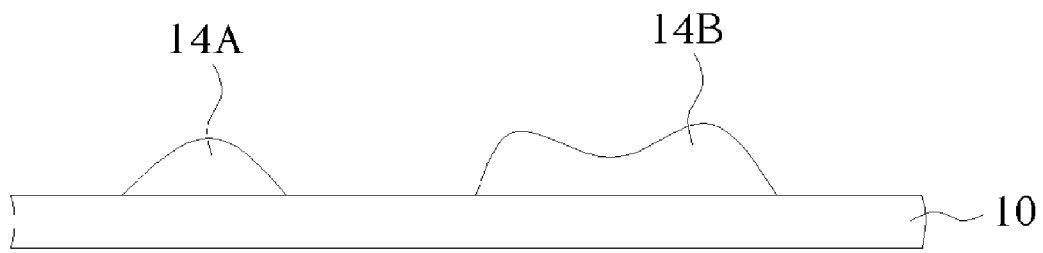
Figure 4:
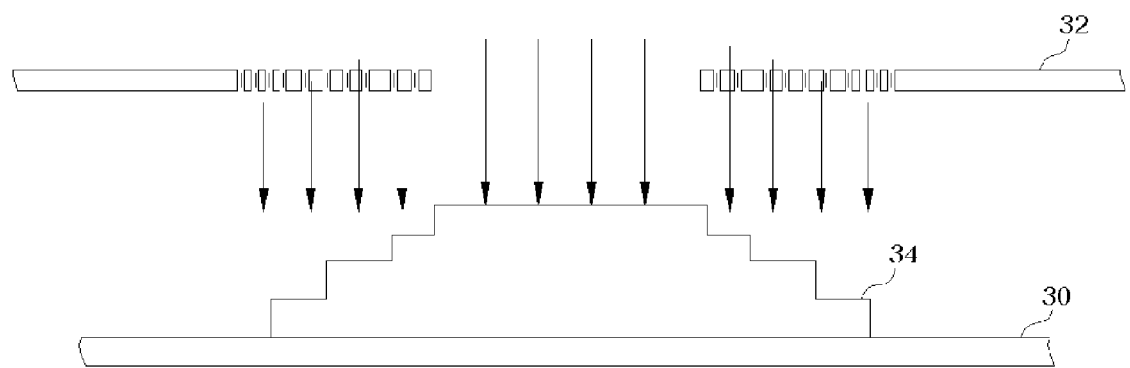
FIG. 4 to FIG. 7 are schematic diagrams illustrating a method of forming a stamper having a plurality of microlens patterns having large dimensions according to a preferred embodiment of the present invention.

Please refer to FIG. 4 to FIG. 7. FIG. 4 to FIG. 7 are schematic diagrams illustrating a method of forming a stamper having a plurality of microlens patterns having large dimensions according to a preferred embodiment of the present invention. As shown in FIG. 4, a substrate 30 is provided, and a photo resist layer (not shown) is coated onto the substrate 30. Then, an exposing and developing process is performed with a half-tone mask 32 to remove parts of the photo resist layer (not shown) so as to form a plurality of photo resist patterns 34. For easy illustration and understanding, only a single photo resist pattern is shown in FIG. 4. Since the half-tone mask 32 has plural openings that have different spacings, the photo resist pattern 34 having a stairway-like shape is formed.

Figure 5:
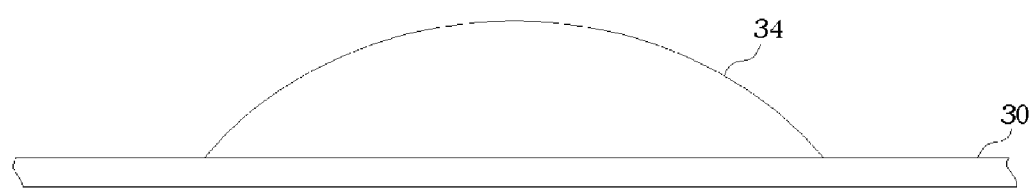

As shown in FIG. 5, a flow process is followed to heat the photo resist patterns 34 so as to raise the temperature of the photo resist pattern 34 over the glass transition temperature. Accordingly, the photo resist pattern 34 will form a microlens surface due to equivalence of surface tension. In comparison with the conventional method, since the photo resist pattern 34 has a stairway-like shape, the photo resist pattern 34 will not collapse during the flow process even though the dimension of the photo resist pattern 34 is larger.

Figure 6:
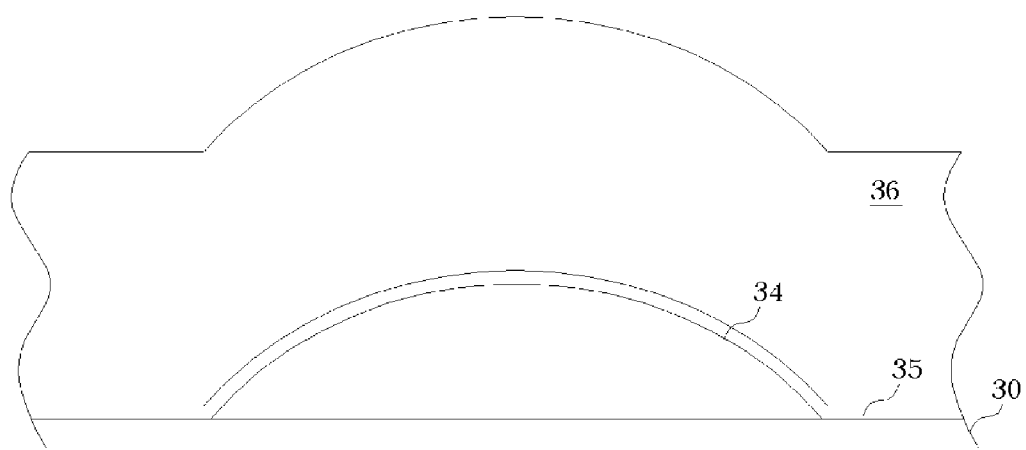

As shown in FIG. 6, when the photo resist pattern 34 having a microlens surface is formed, a seed layer 35 is then formed onto the substrate 30 and the photo resist pattern 34. The seed layer 35 can be formed by evaporating, sputtering, or electro plating technologies. Afterward, the seed layer 35 is electroplated to form a metal plate 36 so as to form a pattern complementary to the photo resist pattern 34 on the bottom surface of the metal plate 36.

Figure 7:
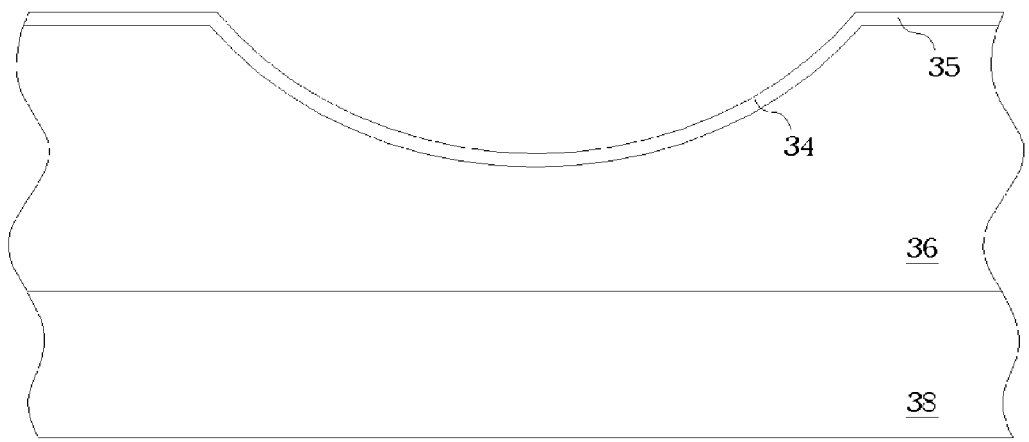

As shown in FIG. 7, the metal plate 36 is separated from the substrate 30 and the photo resist pattern 34. Then, the top surface of the metal plate 36 is planarized, for example, by a polishing machine. Finally, the top surface of the metal plate 36 is combined with an insert mold 38, and can be utilized to form light guide plates having microlens patterns.

It is worth noting that the metal plate 36 serves as a stamper. The microlens patterns are formed in the stamper, instead of the insert mold, is for saving the time and cost. This application is well known in the art, and thus is not redundantly described here. In addition, the material of the metal plate 36 is not limited. A single metal, such as nickel, silver, copper, or composite metals, such as an alloy, can be selected basing on different requirements. Also, the metal plate 36 can be directly formed by physical vapor deposition technologies, such as evaporating or sputtering, or chemical vapor deposition technologies.

Figure 8:
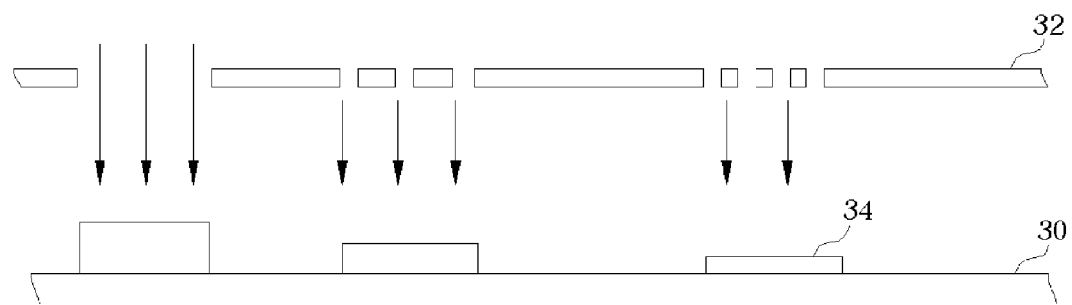
FIG. 8 to FIG. 10 are schematic diagrams illustrating a method of forming a stamper having a plurality of microlens patterns having different heights according to another preferred embodiment of the present invention.
Figure 9:
Figure 10:
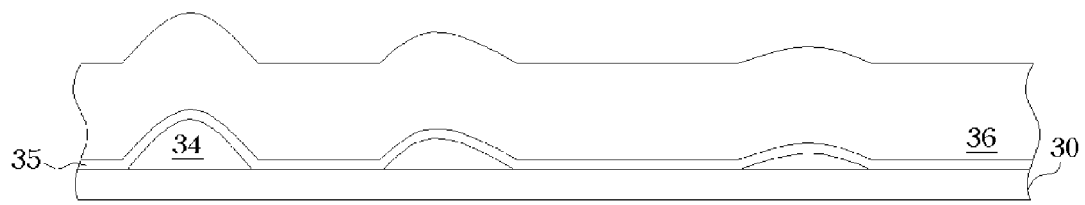

As described, since the light guide plate may have the patterns having different heights, the present invention proposes another preferred embodiment to fulfill this requirement. Please refer to FIG. 8 to FIG. 10. FIG. 8 to FIG. 10 are schematic diagrams illustrating a method of forming a stamper having a plurality of microlens patterns having different heights according to another preferred embodiment of the present invention. As shown in FIG. 8, a substrate 30 is provided, and a photo resist layer (not shown) is coated onto the substrate 30. Then, an exposing and developing process is performed with a half-tone mask 32 to remove parts of the photo resist layer (not shown) so as to form a plurality of photo resist patterns 34. Since the half-tone mask 32 has plural openings that have different spacings, the photo resist patterns 34 having different heights are therefore formed.

As shown in FIG. 9, a flow process is performed to heat the photo resist patterns 34 so as to raise the temperature of the photo resist patterns 34 over the glass transition temperature. Accordingly, each photo resist pattern 34 will form a microlens surface due to equivalence of surface tension. It is to be noted if the dimensions of the photo resist patterns 34 are larger, the half-tone mask (not shown) can be adjusted so that the photo resist patterns 34 can have a stairway-like shape before the flow process as illustrated in the above embodiment.

As shown in FIG. 10, a seed layer 35 is formed onto the substrate 30 and the photo resist patterns 34. The seed layer 35 is then electroplated to form a metal plate 36. Accordingly, the bottom surface of the metal plate 36 will form a plurality of patterns complementary to the photo resist patterns 34. The metal plate 36 is then separated from the substrate 30 and the photo resist pattern 34. Thereafter, the top surface of the metal plate 36 is planarized. Finally, the top surface of the metal plate 36 is combined with an insert mold (not shown).

It is to be noted that the above embodiments illustrate the methods of forming light guide plates having raised patterns. If the required patterns of light guide plates are concave basing on different optical considerations, a second metal plate can be selectively formed on the bottom surface of the metal plate so as to form the patterns complementary to the patterns of the metal plate on the bottom surface of the second metal plate. In such case, the light guide plates having concave microlens patterns can be obtained.

In addition, the present invention is not limited to forming light guide plates, and can be applied to fabricate other injection molding products having microlens patterns with different heights or large dimensions.

In comparison with the prior art, the present invention utilizes the half-tone mask to control the exposing energy, and thus is capable of fabricating the light guide plates or other injection molding products having microlens patterns with different heights or large dimensions.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a stamper by half-tone technology, the method comprising:

providing a substrate, and coating a photo resist layer onto the substrate;

performing an exposing and developing process with a half-tone mask to remove a portion of the photo resist layer so as to form a plurality of photo resist patterns having different heights;

performing a flow process for forming a microlens surface on each photo resist pattern;

forming a metal layer overlying the substrate and the photo resist patterns so as to form a plurality of patterns complementary to the photo resist patterns on a bottom surface of the metal layer;

separating the metal layer from the substrate and the photo resist patterns; and planarizing a top surface of the metal layer, and combining the top surface of the metal layer with an insert mold.

2. The method of claim 1 wherein the plurality of patterns formed on the bottom surface of the metal layer are utilized for fabricating a light guide plate.

3. The method of claim 1 wherein the metal layer is formed by electroforming technology, and before the metal layer is formed the method further comprises forming a seed layer onto the substrate and the photo resist patterns.

4. The method of claim 3 wherein the metal layer is formed by single metal electroplating technology.

5. The method of claim 3 wherein the metal layer is formed by alloy electroplating technology.

6. The method of claim 3 wherein the seed layer is formed by evaporating, sputtering, or electroless plating technologies.

7. The method of claim 1 wherein the metal layer is formed by evaporating or sputtering technologies.

\* \* \* \* \*